(12) United States Patent
Ogi et al.

(10) Patent No.: US 10,458,004 B2
(45) Date of Patent: Oct. 29, 2019

(54) SILVER-BISMUTH POWDER, CONDUCTIVE PASTE AND CONDUCTIVE FILM

(71) Applicant: DOWA Electronics Materials Co., Ltd., Tokyo (JP)

(72) Inventors: Kozo Ogi, Tokyo (JP); Kenichi Inoue, Tokyo (JP); Atsushi Ebara, Tokyo (JP); Akihiro Asano, Tokyo (JP); Hideyuki Fujimoto, Tokyo (JP); Takahiro Yamada, Tokyo (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 368 days.

(21) Appl. No.: 14/918,948

(22) Filed: Oct. 21, 2015

(65) Prior Publication Data
US 2016/0040271 A1 Feb. 11, 2016

Related U.S. Application Data

(63) Continuation of application No. PCT/JP2014/059016, filed on Mar. 27, 2014.

(30) Foreign Application Priority Data

Apr. 25, 2013 (JP) .................. 2013-092094

(51) Int. Cl.
*C22C 12/00* (2006.01)
*H05K 1/09* (2006.01)
(Continued)

(52) U.S. Cl.
CPC ................ *C22C 12/00* (2013.01); *C22C 5/06* (2013.01); *H01B 1/22* (2013.01)

(58) Field of Classification Search
CPC .......... C22C 12/00; C22C 5/06; H05K 1/092; H05K 2203/1126; B22F 2009/0828; B22F 1/0014; B22F 9/08; H01B 1/22
See application file for complete search history.

(56) References Cited

U.S. PATENT DOCUMENTS 5,198,154 A * 3/1993 Yokoyama .............. B22F 1/025
  252/512
5,302,557 A * 4/1994 Carroll ...................... C03C 8/14
  106/1.13
(Continued)

FOREIGN PATENT DOCUMENTS

EP    0 474 879     3/1992
JP    2004-528992   9/2004
(Continued)

OTHER PUBLICATIONS

English Translation of JP2013014790 (Year: 2013).*
(Continued)

*Primary Examiner* — Andrew J. Oyer
(74) *Attorney, Agent, or Firm* — Carmody Torrance Sandak & Hennessey LLP

(57) ABSTRACT

To provide a silver-bismuth powder, which includes: silver; and bismuth, wherein a mass ratio (silver:bismuth) of the silver to the bismuth is 95:5 to 40:60, wherein a cumulative 50% point of particle diameter (D50) of the silver-bismuth powder in a volume-based particle size distribution thereof as measured by a laser diffraction particle size distribution analysis is 0.1 μm to 10 μm, and wherein an oxygen content of the silver-bismuth powder is 5.5% by mass or less.

6 Claims, 1 Drawing Sheet

(51) Int. Cl.
*B22F 1/00* (2006.01)
*H01B 1/22* (2006.01)
*C22C 5/06* (2006.01)
*B22F 9/08* (2006.01)

(56) References Cited

U.S. PATENT DOCUMENTS

| | | |
|---|---|---|
| 2009/0029057 A1 | 1/2009 | Brown et al. |
| 2011/0006268 A1 | 1/2011 | Wang et al. |
| 2011/0171372 A1 | 7/2011 | Shearer et al. |
| 2012/0153238 A1 | 6/2012 | Glicksman et al. |
| 2014/0170524 A1 | 6/2014 | Chang et al. |

FOREIGN PATENT DOCUMENTS

| | | |
|---|---|---|
| JP | 2008-227204 | 9/2008 |
| JP | 2010-123681 | 6/2010 |
| JP | 2010123681 A * | 6/2010 |
| JP | 2011-514432 | 5/2011 |
| JP | 2012-125791 | 7/2012 |
| JP | 2012125791 A * | 7/2012 |
| JP | 2013-014790 | 1/2013 |
| JP | 2013014790 A * | 1/2013 |
| JP | 2011-036901 | 2/2014 |
| TW | 201301528 | 1/2013 |
| WO | 2012/160921 | 11/2012 |

OTHER PUBLICATIONS

English Translation of JP2010123681 (Year: 2010).*
Tomonori et al. English Translation of JP2012125791 (Year: 2012).*
Chinese Office Action dated Dec. 5, 2016 issued for corresponding CN application.
Singapore Search Report and Written Opinion dated Sep. 1, 2016 issued for corresponding SG application.
Taiwan Intellectual Property Office, Taiwanese Office Action issued for corresponding Taiwanese Application No. 103114579, dated Dec. 5, 2017.

* cited by examiner

SILVER-BISMUTH POWDER, CONDUCTIVE PASTE AND CONDUCTIVE FILM

TECHNICAL FIELD

The present invention relates to a silver-bismuth powder, a conductive paste, and a conductive film.

BACKGROUND ART

Use of copper as a wiring material and an electrode material has been conventionally studied, and copper is used in a conductive paste used for a printed circuit board, which is cured or dried at a relatively low temperature (200° C. or lower). When the conductive paste is used for an application, where the conductive paste is burned at a relatively high temperature (500° C. or higher), however, conductivity is reduced due to oxidation of the copper, then the conductive paste cannot be used in an oxidizing atmosphere, and can be only used in a special atmosphere, such as a nitrogen atmosphere, and a reducing atmosphere. From the reason as mentioned, silver is often used for an application where a conductive paste is burned in an oxidizing atmosphere of a relatively high temperature, but use of the silver has a problem that a cost is increased, as the cost of the silver is higher than that of the copper. Use of a silver-plated copper powder has been studied to attain characteristics in between copper and silver, and to reduce the cost. The oxidation resistance thereof is improved compared to copper, but use of the silver-plated copper powder still has a problem that it cannot be used for an application where a conductive paste is burned in an oxidizing atmosphere of a relatively high temperature.

In order to solve the aforementioned problems, for example, proposed is a multi-element alloy powder including silver, and at least two non-silver elements (see PTL 1). However, this proposal is intended to be used as an alloy powder for ceramic piezoelectric device. Therefore, the powder contains precious metals, such as palladium, and platinum, and has a high melting point. In addition, the powder is produced by an aerosol pyrolysis method. Therefore, the productivity thereof is low, and it is difficult to achieve a low cost.

Moreover, proposed is a lead-free brazing filler metal composed of an alloy including bismuth as a base (see PTL 2). However, the bismuth content is high, i.e., 80% by mass or greater, as well as the brazing filler metal is not intended to be applied for such use that it is burned at a relatively high temperature. Therefore, there is a problem that the conductivity is reduced, when the brazing filler metal is applied for use that it is burned in an oxidizing atmosphere of a relatively high temperature.

Furthermore, proposed are metal balls for a wiring board, which contain μg and/or Cu in an amount of 20% by mass to 80% by mass in total, and the remainder composed of Bi and unavoidable impurities, and are obtained by solidifying into balls having particle diameters of 0.03 mm to 0.5 mm, where a circularity of the metal ball is 5% or less of the particle diameters (see PTL 3). However, this proposal has a problem that these metal balls cannot be used as a filler of a conductive paste, because the particle sizes of the metal balls are large.

Accordingly, there are needs for a silver-bismuth powder having excellent solder wettability, low volume resistivity, and excellent conductivity for such use that it is burned in an oxidation atmosphere of a relatively high temperature (500° C. or higher), as well as a conductive paste, and a conductive film.

CITATION LIST

Patent Literature

PTL 1: Japanese Patent Application Laid-Open (JP-A) No. 2011-514432
PTL 2: JP-A No. 2004-528992
PTL 3: JP-A No. 2010-123681

SUMMARY OF INVENTION

Technical Problem

The present invention aims to solve the aforementioned various problems in the art, and to achieve the following object. Namely, the object of the present invention is to provide a silver-bismuth powder, which has excellent solder wettability, low volume resistivity, and excellent conductivity for such use that it is burned in an oxidation atmosphere of a relatively high temperature (500° C. or higher), and to provide a conductive paste and a conductive film.

Solution to Problem

As the means for solving the aforementioned problems, the silver-bismuth powder of the present invention includes:
 silver; and
 bismuth,
 wherein a mass ratio (silver:bismuth) of the silver to the bismuth is 95:5 to 40:60,
 wherein a cumulative 50% point of particle diameter (D50) of the silver-bismuth powder in a volume-based particle size distribution thereof as measured by a laser diffraction particle size distribution analysis is 0.1 μm to 10 μm, and
 wherein an oxygen content of the silver-bismuth powder is 5.5% by mass or less.

Advantageous Effects of Invention

The present invention can solve the aforementioned various problems in the art, achieve the aforementioned object, and can provide a silver-bismuth powder, which has excellent solder wettability, low volume resistivity, and excellent conductivity for such use that it is burned in an oxidation atmosphere of a relatively high temperature (500° C. or higher), as well as providing a conductive paste and a conductive film.

DESCRIPTION OF EMBODIMENTS (Silver-Bismuth Powder)

Figure 1:
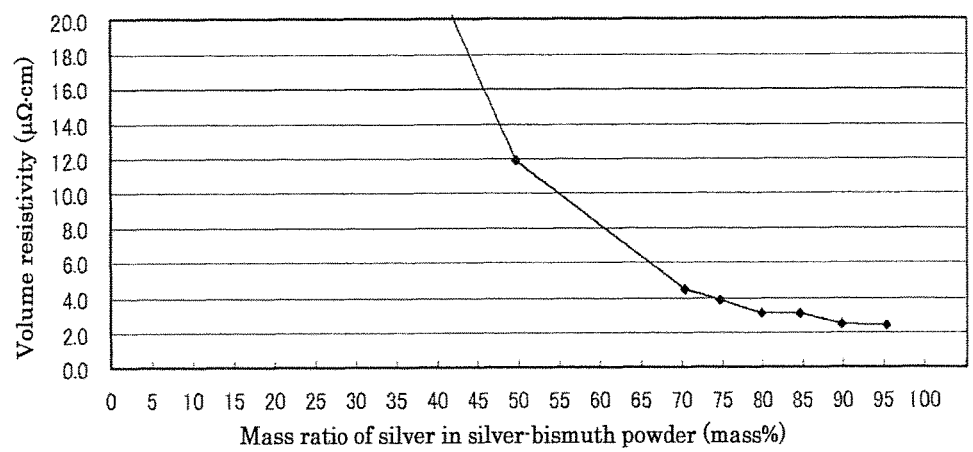
FIG. 1 is a graph depicting a relationship between a silver mass ratio in the powder of the example, and volume resistivity.

The silver-bismuth powder of the present invention contains silver and bismuth.

A mass ratio (silver:bismuth) of the silver to the bismuth is 95:5 to 40:60, preferably 95:5 to 70:30. In view of low volume resistivity, solder wettability, and low cost, the mass ratio thereof is more preferably 90:10 to 80:20. When the mass ratio is within the aforementioned numerical range, solder wettability of the silver-bismuth powder is excellent, and volume resistivity thereof is low.

The silver-bismuth powder can achieve a reduction in the cost through a replacement of part of silver that is a novel metal with bismuth that is a base metal. The silver-bismuth powder exhibits conductivity, even when it is burned in an oxidizing atmosphere, as the mass ratio (silver:bismuth) is within the aforementioned range. It is considered that the silver-bismuth powder exhibits conductivity, even when it is applied for use that it is burned in an oxidizing atmosphere of a relatively high temperature (500° C. or higher), because (1) silver and bismuth are separated into two layers when melted, hence the bismuth tends not to be locally present at an interface of a burned silver film, (2) an intermetallic compound, which has poor conductivity, is hardly generated, (3) sintering is accelerated as the silver induces liquid-phase sintering in the melted bismuth.

A cumulative 50% point of particle diameter (D50) of the silver-bismuth powder in a volume-based particle size distribution thereof as measured by a laser diffraction particle size distribution analysis is 0.1 μm to 10 μm, preferably 0.5 μm to 4 μm. When the particle size is within the aforementioned numerical range, a resulting powder can be suitably used as an economical filler for a conductive paste.

When the cumulative 50% point of particle diameter (D50) is less than 0.1 μm, a conductive film produced with the silver-bismuth powder may have high volume resistivity. When the cumulative 50% point of particle diameter (D50) is greater than 10 μm, clogging occurs at the time of screen printing, and it may be difficult to produce a fine line.

The cumulative 50% point of particle diameter (D50) of the silver-bismuth powder is measured, for example, by a laser diffraction particle size distribution analyzer (Helos particle size distribution analyzer, manufactured by SYMPATEC GmbH) using a value calculated from a volume-based particle size distribution.

The oxygen content of the silver-bismuth powder is 5.5% by mass or less, preferably 2% by mass or less. When the oxygen content is greater than 5.5% by mass, a conductive film produced with a resulting silver-bismuth powder may have high volume resistivity.

For example, the oxygen content can be measured by means of an oxygen and nitrogen analyzer (TC-436, manufactured by LECO Corporation).

The BET specific surface area of the silver-bismuth powder is appropriately selected depending on the intended purpose without any limitation, and the BET specific surface area thereof is preferably 0.1 $m^2$/g to 5 $m^2$/g.

For example, the BET specific surface area can be measured by means of a BET specific surface area measuring device (4 Sorb US, manufactured by Yuasa Ionics Co., Ltd.).

The tap density of the silver-bismuth powder is appropriately selected depending on the intended purpose without any limitation, and the tap density thereof is preferably 1.0 g/$cm^3$ to 10.0 g/$cm^3$.

For example, the tap density can be measured by the method described in JP-A No. 2007-263860.

<Production Method of Silver-Bismuth Powder>

A production method of the silver-bismuth powder is appropriately selected depending on the intended purpose without any limitation, and examples of the production method include a wet reduction process, a gas-phase reduction process, and an atomization process. Among them, an atomization process is preferable because mass production can be realized at low cost, and a water atomization process is more preferable in view of productivity, and easiness for forming an alloy, and fine particles.

The atomization process is a method where a jet of high pressure gas or water is applied to a silver-bismuth melt as a pulverization medium to pulverize the silver-bismuth melt, and the pulverized silver-bismuth melt is cooled, and solidified to produce a silver-bismuth powder.

In accordance with the water atomization process where water is used as the pulverization medium, a powder having a small particle size can be produced, as shearing energy is large even through shearing is performed at the same linear speed to that of gas, as mass of water is heavier than that of gas.

The silver-bismuth powder can be produced by filtering the powder obtained by the water atomization process, washing with water, drying, crushing, classifying, and sieving.

The drying is preferably performed in a nitrogen atmosphere. It is preferred that slow oxidation be performed by increasing an oxygen concentration by two steps, after drying for 5 hours to 50 hours at 60° C. to 150° C. As heat generation by oxidation is large, stabilization can be achieved with the slow oxidation. Examples of the slow oxidation include a method, where it is processed for 12.5 hours with an oxygen concentration of 15%, after processing for 30 minutes with the oxygen concentration of 2%.

The classification is appropriately selected depending on the intended purpose without any limitation, but air classification is preferable.

(Conductive Paste)

The conductive paste of the present invention contains a silver-bismuth powder, a glass frit, a resin, and a solvent, and may further contain other components, if necessary.

<Silver-Bismuth Powder>

As for the silver-bismuth powder, the silver-bismuth powder of the present invention is used.

An amount of the silver-bismuth powder is appropriately selected depending on the intended purpose without any limitation, and the amount thereof is preferably 40% by mass to 90% by mass, relative to a total amount of the conductive paste.

<Glass Frit>

The glass frit is a substance for bonding the silver-bismuth powder to a substrate, when burned.

The glass frit is appropriately selected depending on the intended purpose without any limitation, and examples thereof include a bismuth borosilicate-based glass fit, an alkali metal borosilicate-based glass fit, an alkaline earth metal borosilicate-based glass frit, a zinc borosilicate-based glass frit, a lead borosilicate-based glass frit, a lead borate-based glass fit, and a lead silicate-based glass fit. These may be used alone, or in combination. Note that, the glass frit is preferably a glass frit free from lead in view of an adverse influence of lead to the environment.

The softening point of the glass frit is appropriately selected depending on the intended purpose without any limitation, but the softening point thereof is preferably 400° C. to 600° C. When the softening point thereof is lower than 400° C., the sintering of the glass starts before the resin component in the conductive paste is evaporated, and thus a debinder process is not carried out smoothly. As a result, the resin component becomes carbon residues after burning, which may cause pealing of a conductive film. When the softening point thereof is higher than 600° C., a fine conductive film having a sufficient adhesion strength may not be attained, if burning is performed at a temperature equal to or lower than about 600° C.

The softening point can be determined from the temperature of the bottom width of the second endothermic portion of the DTA curve measured by, for example, a thermogravimetric analyzer.

An amount of the glass frits appropriately selected depending on the intended purpose without any limitation, and the amount thereof is preferably 0.1% by mass to 10% by mass, relative to the silver-bismuth powder.

<Resin>

The resin is appropriately selected depending on the intended purpose without any limitation, and examples of the resin include an acrylic resin, ethyl cellulose, ethyl hydroxyethyl cellulose, and nitrocellulose. These may be used alone, or in combination.

The solvent is appropriately selected depending on the intended purpose without any limitation, and examples of the solvent include toluene, methyl ethyl ketone, methyl isobutyl ketone, tetradecane, tetralin, propyl alcohol, isopropyl alcohol, terpineol, ethyl carbitol, butyl carbitol, ethyl carbitol acetate, butyl carbitol acetate, and 2,2,4-trimethyl-1,3-pentanediol monoisobutylate. These may be used alone, or in combination.

The aforementioned other components are appropriately selected depending on the intended purpose without any limitation, and examples thereof include a dispersing agent, and a viscosity improver.

A production method of the conductive paste is appropriately selected depending on the intended purpose without any limitation. For example, the conductive paste can be produced by mixing the silver-bismuth powder, the glass frit, the resin, the solvent, and other components, if necessary, using an ultrasonic disperser, a disperser, a triple roll mill, a ball mill, a bead mill, a biaxial kneader, and a planetary centrifugal stirrer.

The viscosity of the conductive paste is preferably 10 Pa·s to 1,000 Pa·s at 25° C.

When the viscosity of the conductive paste is less than 10 Pa·s, so-called "bleeding" may occur at a low viscosity range. When the viscosity thereof is greater than 1,000 Pa·s, a printing defect, such as "blurred print" may occur.

The viscosity of the conductive paste can be adjusted with an amount of the silver-bismuth powder, addition of a viscosity improver, or a type of a solvent for use.

The conductive paste of the present invention is used as a burning-type conductive paste, and is suitably used for formation of the conductive film of the present invention, which is explained hereinafter.

(Conductive Film)

The conductive film of the present invention is obtained by burnihg the conductive paste of the present invention.

The conductive film is obtained by applying the conductive paste of the present invention on a substrate through coating, followed by drying, and then burning the dried coating film.

The coating is appropriately selected depending on the intended purpose without any limitation, and examples thereof include screen printing, gravure printing, wire-bar coating, doctor blade coating, and roller coating. Among them, screen printing is preferable.

The burning temperature of the coating film is appropriately selected depending on the intended purpose without any limitation. The burning temperature thereof is preferably equal to or higher than a softening point of the glass frit contained in the conductive paste. Specifically, the burning temperature is preferably 500° C. to 700° C. When the burning temperature is lower than the softening point of the glass frit, the fluidity of the glass frit becomes insufficient, and thus a conductive film having sufficient strength may not be attained.

The burning time of the coating film cannot be unconditionally defined, as it varies depending on the burning temperature. However, the burning time thereof is preferably 1 minute to 120 minutes.

The burning of the coating film is appropriately selected depending on the intended purpose without any limitation, and the burning thereof is preferably performed in the atmospheric air.

The conductive film of the present invention, which is obtained by burning the conductive paste of the present invention, is suitably used, for example, for electrodes and circuits of various electronic parts, such as solar batteries, chip parts, hybrid ICs, defoggers, thermistors, varistors, thermal heads, liquid crystal displays (LCD), plasma displays (PDP), field emission display (FED) devices, and electromagnetic shielding materials.

EXAMPLES

The present invention is explained through examples hereinafter, but the present invention is not limited these examples.

Example 1

<Production of Powder by Water Atomization Process>

A molten metal obtained by heating and melting silver and bismuth of the blending ratio depicted in Table 1 was dropped from a bottom part of a tundish, to which high-pressure water was sprayed to quench and solidify the molten metal. The resulting powder was filtered, and washed with water. Thereafter, the powder was dried (for 7 hours at 120° C.), crushed, and then subjected to an air classification process, to thereby produce each powder of Nos. 1 to 12.

For example, 3.8 kg of silver and 0.2 kg of bismuth were blended for the powder of No. 2.

Next, each of the produced powders were evaluated in various properties thereof in the following manners. The results are presented in Table 1.

<Particle Size Distribution>

As for a particle size distribution of each of the produced powders a cumulative 10% point of particle diameter (D10), a cumulative 25% point of particle diameter (D25), a cumulative 50% point of particle diameter (D50), a cumulative 75% point of particle diameter (D75), a cumulative 90% point of particle diameter (D90), and a cumulative 99% point of particle diameter (D99) were measured by means of a laser diffraction particle size analyzer (Helos particle size distribution analyzer, manufactured by SYMPATEC GmbH) under the measuring conditions that the focal length was 20 mm, and the dispersive pressure of 5.0 bar.

<BET Specific Surface Area>

The BET specific surface area of each of the produced powders was determined by means of a BET specific surface area measuring device (4 Sorb US, manufactured by Yuasa Ionics Co., Ltd.) in accordance with the BET method.

<Tap Density>

The tap density (TAP) of each of the produced powders was determined by the method described in JP-A No. 2007-263860.

<Oxygen Content>

The oxygen content of each of the produced powders was measured by means of an oxygen and nitrogen analyzer (TC-436, manufactured by LECO Corporation).

<Composition Analysis>

The amounts of the silver and the bismuth in each of the produced powders were determined in the following manner. After filling a vinyl chloride ring (inner diameter 3.2 mm×thickness 4 mm) with the powder (about 2.5 g), a load of 100 kN was applied to the powder by means of a pellet forming compressor machine (Model: BRE-50, manufactured by Maekawa Testing Machine MFG. Co., Ltd.), to thereby produce a pellet of each powder.

Each of the produced pellets was placed in a sample holder (opening diameter: 3.0 cm), and set at a measuring position within an X-ray fluorescence spectrometer (RIX2000, manufactured by Rigaku Corporation). A measurement was performed under the conditions that a measuring atmosphere was under reduced pressure (8.0 Pa), and an X-ray output was 50 kV, and 50 mA. The amounts of the silver and the bismuth in each powder was determined by automatically calculating from the measurement result using a software attached to the device.

mill 5 times to thereby homogeneously disperse the mixture. In the manner as described, conductive pastes of Nos. 1 to 12 were produced.

<Production of Conductive Film>

Each of the obtained conductive pastes was applied onto an aluminum substrate into a pattern having a line width of 500 μm, and a line length of 37.5 mm by screen printing, followed by drying in the atmospheric air for 10 minutes at 150° C. by means of a drier (DK-43, manufactured by Yamato Scientific Co., Ltd.). Thereafter, the resultant was burned in the atmospheric air for 3.3 minutes at 600° C. using a burning furnace (small conveyor furnace 810A, Koyo Thermo Systems Co., Ltd.), to produce each of conductive films Nos. 1 to 12.

Subsequently, each of the produced conductive films was subjected to evaluations of volume resistivity and solder wettability in the following manners. The results are presented in Table 2, and FIGS. 1 and 2.

<<Volume Resistivity>>

Line resistance of each of the obtained conductive film was measured by means of a two-terminal resistivity meter (3540 Milliohm HiTester, manufactured by Hioki E. E. Corporation), and a film thickness thereof was measured by

TABLE 1

| Powder No. | Blending ratio (mass %) | | Oxygen content (mass %) | BET specific surface area ($m^2/g$) | Tap density ($g/cm^3$) |
|---|---|---|---|---|---|
| | Silver | Bismuth | | | |
| 1 | 100 | 0 | 0.1 | 0.49 | 5.0 |
| 2 | 95 | 5 | | | |
| 3 | 90 | 10 | | | |
| 4 | 85 | 15 | | | |
| 5 | 80 | 20 | | | |
| 6 | 75 | 25 | | | |
| 7 | 70 | 30 | 1.9 | 1.87 | 3.5 |
| 8 | 50 | 50 | 2.5 | 2.61 | 3.1 |
| 9 | 40 | 60 | | | |
| 10 | 35 | 65 | | | |
| 11 | 30 | 70 | 5.7 | 2.04 | 3.3 |
| 12 | 0 | 100 | 1.3 | 2.06 | 3.3 |

| Powder No. | Particle size distribution (μm) | | | | | | Amount of silver (mass %) | Amount of bismuth (mass %) |
|---|---|---|---|---|---|---|---|---|
| | D10 | D25 | D50 | D75 | D90 | D99 | | |
| 1 | 1.1 | 1.8 | 2.6 | 3.4 | 4.2 | 5.9 | 100 | 0 |
| 2 | | | | | | | 95.4 | 4.6 |
| 3 | | | | | | | 89.8 | 10.2 |
| 4 | | | | | | | 84.6 | 15.4 |
| 5 | | | | | | | 79.9 | 20.1 |
| 6 | | | | | | | 74.7 | 25.3 |
| 7 | 0.7 | 1.1 | 1.8 | 2.6 | 3.5 | 5.7 | 70.3 | 29.7 |
| 8 | 0.6 | 0.9 | 1.5 | 2.2 | 3.0 | 4.9 | 49.7 | 50.3 |
| 9 | | | | | | | 38.5 | 61.5 |
| 10 | | | | | | | 34.1 | 65.9 |
| 11 | 0.6 | 1.0 | 1.7 | 2.6 | 3.8 | 7.6 | 26.6 | 73.4 |
| 12 | 0.8 | 1.3 | 2.1 | 3.8 | 6.7 | 14.5 | 0 | 100 |

Example 2

<Production of Conductive Paste>

A vehicle prepared by dissolving 4 g of an acrylic resin (BR-105, manufactured by Mitsubishi Rayon Co., Ltd.) in 12 g of butyl carbitol acetate (reagent, manufactured by Wako Pure Chemical Industries, Ltd.), 82 g of each of the produced powders, and 2 g of a glass frit (ASF-1100, manufactured by ASAHI GLASS CO., LTD., softening point: 440° C.) were mixed by means of a kneading deaerator, and the resulting mixture was passed through a triple roll means of a surface texture and contour measuring instrument (SURFCOM 1500DX, manufactured by TOKYO SEIMITSU CO., LTD.). Based on the obtained results, a volume resistivity was calculated using the following formula.

$$\text{Volume resistivity}(\mu\Omega \cdot \text{cm}) = \text{line resistance}(\mu\Omega) \times \text{film thickness (cm)} \times \text{line width (cm)} / \text{line length (cm)}$$

<<Solder Wettability>>

Flux (ESR-250T4, manufactured by Senju Metal Industry Co., Ltd.) was deposited on a pad portion (a square pattern portion (2 mm×2 mm) of each conductive film), followed by solder dipping for 2 second in a solder pot set at 260° C. After the dip soldering, an area of the square pattern portion wetted with the solder was confirmed visually, and a solder wettability (%) was determined by dividing the area of the portion where the solder was raised with the area of the pad portion, and multiplying with 100. Note that, the solder wettability of 70% or greater is preferable.

TABLE 2

| Conductive film No. | Blending ratio of powder (mass %) | | Volume resistivity (μΩ · cm) | Solder wettability (%) |
|---|---|---|---|---|
| | Silver | Bismuth | | |
| 1 | 100 | 0 | 3.4 | 95 |
| 2 | 95 | 5 | 2.4 | 95 |
| 3 | 90 | 10 | 2.5 | 90 |
| 4 | 85 | 15 | 3.1 | 90 |
| 5 | 80 | 20 | 3.1 | 85 |
| 6 | 75 | 25 | 3.9 | 70 |
| 7 | 70 | 30 | 4.5 | 70 |
| 8 | 50 | 50 | 11.9 | 30 |
| 9 | 40 | 60 | 23.8 | 10 |
| 10 | 35 | 65 | 54.9 | 0 |
| 11 | 30 | 70 | 1,600,000 or greater | 0 |
| 12 | 0 | 100 | 1,600,000 or greater | 0 |

Figure 2:
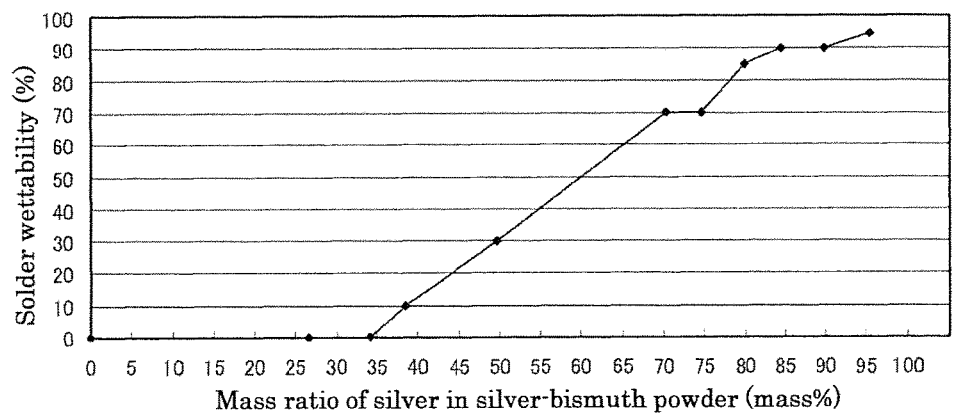
FIG. 2 is a graph depicting a relationship between a silver mass ratio in the powder of the example, and solder wettability.

It was found from the results depicted in Table 2, FIGS. 1 and 2 that the volume resistivity was low, and the solder wettability was excellent, when the mass ratio of the silver in the powder was 70% or greater.

For example, the embodiments of the present invention are as follows:

<1> A silver-bismuth powder, including:
  silver; and
  bismuth,
  wherein a mass ratio (silver:bismuth) of the silver to the bismuth is 95:5 to 40:60,
  wherein a cumulative 50% point of particle diameter (D50) of the silver-bismuth powder in a volume-based particle size distribution thereof as measured by a laser diffraction particle size distribution analysis is 0.1 μm to 10 μm, and
  wherein an oxygen content of the silver-bismuth powder is 5.5% by mass or less.
<2> The silver-bismuth powder according to <1>, wherein the cumulative 50% point of particle diameter (D50) of the silver-bismuth powder in the volume-based particle size distribution thereof as measured by the laser diffraction particle size distribution analysis is 0.5 μm to 4 μm.
<3> The silver-bismuth powder according to <1> or <2>, wherein the mass ratio (silver:bismuth) of the silver to the bismuth is 95:5 to 70:30.
<4> The silver-bismuth powder according to any one of <1> to <3>, wherein the silver-bismuth powder is produced by a water atomization process.
<5> A conductive paste, including:
  the silver-bismuth powder according to any one of <1> to <4>;
  a resin;
  a glass frit; and
  a solvent.
<6> The conductive paste according to <5>, wherein a softening point of the glass fit is 400° C. to 600° C.
<7> A conductive film, obtained by a method including:
  burning the conductive paste according to <5> or <6>.
<8> The conductive film according to <7>, wherein the burning is performed at a temperature equal to or higher than a softening point of the glass frit.

What is claimed is:

1. A silver-bismuth powder comprising metals, wherein the metals consist of silver and bismuth,
  wherein a mass ratio (silver:bismuth) of the silver to the bismuth is 95:5 to 40:60,
  wherein a cumulative 50% point of particle diameter (D50) of the silver-bismuth powder in a volume-based particle size distribution thereof as measured by a laser diffraction particle size distribution analysis is 0.5 μm to 4 μm, and
  wherein an oxygen content of the silver-bismuth powder is 5.5% by mass or less,
  wherein the silver-bismuth powder is configured to form a conductive film when burned at 500° C. or higher.

2. A silver-bismuth powder comprising metals, wherein the metals consist of silver and bismuth, wherein a mass ratio (silver:bismuth) of the silver to the bismuth is 95:5 to 70:30,
  wherein a cumulative 50% point of particle diameter (D50) of the silver-bismuth powder in a volume-based particle size distribution thereof as measured by a laser diffraction particle size distribution analysis is 0.1 μm to 10 μm, and
  wherein an oxygen content of the silver-bismuth powder is 5.5% by mass or less,
  wherein the silver-bismuth powder is configured to form a conductive film when burned at 500° C. or higher.

3. The silver-bismuth powder according to claim 1, wherein the silver-bismuth powder is produced by a water atomization process.

4. A conductive paste, comprising:
  a silver-bismuth powder;
  a resin;
  a glass frit; and
  a solvent,
  wherein the silver-bismuth powder comprising metals, wherein the metals consists of silver and bismuth,
  wherein a mass ratio (silver:bismuth) of the silver to the bismuth is 95:5 to 40:60,
  wherein a cumulative 50% point of particle diameter (D50) of the silver-bismuth powder in a volume-based particle size distribution thereof as measured by a laser diffraction particle size distribution analysis is 0.1 μm to 10 μm, and
  wherein an oxygen content of the silver-bismuth powder is 5.5% by mass or less,
  wherein the conductive paste is configured to form a conductive film when burned at 500° C. or higher.

5. The conductive paste according to claim 4, wherein a softening point of the glass frit is 400° C. to 600° C.

6. The silver-bismuth powder according to claim 2, wherein the silver-bismuth powder is produced by a water atomization process.

* * * * *